US012628616B2

(12) United States Patent
Lee et al.

(10) Patent No.: US 12,628,616 B2
(45) Date of Patent: May 12, 2026

(54) WAFER CHUCK TABLE AND WAFER CHUCK SYSTEM

(71) Applicant: Samsung Electronics Co., Ltd., Suwon-si (KR)

(72) Inventors: Jonggu Lee, Seoul (KR); Sunghyup Kim, Hwaseong-si (KR); Jeongdu Kim, Seoul (KR); Hyeonjin Kim, Seoul (KR); Junghwan Kim, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 933 days.

(21) Appl. No.: 17/893,659

(22) Filed: Aug. 23, 2022

(65) Prior Publication Data

US 2023/0207369 A1 Jun. 29, 2023

(30) Foreign Application Priority Data

Dec. 29, 2021 (KR) ........................ 10-2021-0191087

(51) Int. Cl.
*H10P 72/76* (2026.01)
*B24B 7/22* (2006.01)

(52) U.S. Cl.
CPC ...... *H10P 72/7612* (2026.01); *H10P 72/7614* (2026.01); *B24B 7/228* (2013.01)

(58) Field of Classification Search
CPC ........ B24B 7/228; B23Q 3/088; B23Q 3/106; H10P 72/7612; H10P 72/7614; H10P 72/50; H10P 72/7608; H10P 72/7618; H01L 21/68742; H01L 21/6875; H01L 21/68764; H01L 21/68785
See application file for complete search history.

(56) References Cited

U.S. PATENT DOCUMENTS

| | | | |
|---|---|---|---|
| 7,198,276 | B2 | 4/2007 | Caldwell et al. |
| 2010/0112468 | A1 | 5/2010 | Poock et al. |
| 2012/0002181 | A1 | 1/2012 | Kyoh |
| 2016/0306285 | A1 | 10/2016 | Huang et al. |

(Continued)

FOREIGN PATENT DOCUMENTS

| | | |
|---|---|---|
| JP | 2005-064514 A | 3/2005 |
| JP | 2006-135062 A | 5/2006 |

(Continued)

OTHER PUBLICATIONS

Notice of Allowance in Korean Appln. No. 10-2021-0191087, mailed on Oct. 13, 2025, 6 pages (with English translation).

*Primary Examiner* — Christopher J. Besler
(74) *Attorney, Agent, or Firm* — Fish & Richardson P.C.

(57) ABSTRACT

A wafer chuck table includes a center plate having a plurality of first protrusions each having an upper end at least partially defining a first reference plane, segmented plates arranged around the center plate and having a plurality of second protrusions, each having an upper end at least partially defining a second reference plane such that the segmented plates have separate, respective pluralities of second protrusions at least partially defining separate, respective second reference planes, and driving units configured to adjust an inclination angle of the segmented plates with respect to the center plate so that the first reference plane and the separate, respective second reference planes are coplanar.

13 Claims, 13 Drawing Sheets

(56)                    References Cited

U.S. PATENT DOCUMENTS

| | | | |
|---|---|---|---|
| 2020/0166855 | A1 | 5/2020 | Judge et al. |
| 2021/0066114 | A1 | 3/2021 | Chen et al. |
| 2022/0250168 | A1 * | 8/2022 | Nishri ................... B23B 31/307 |

FOREIGN PATENT DOCUMENTS

| | | | |
|---|---|---|---|
| KR | 101794602 | B1 | 11/2017 |
| KR | 10-2019-0088888 | A | 7/2019 |
| KR | 10-2021-0008310 | A | 1/2021 |

* cited by examiner

WAFER CHUCK TABLE AND WAFER CHUCK SYSTEM

CROSS-REFERENCE TO RELATED APPLICATION

This application claims benefit of priority under 35 U.S.C. § 119 to Korean Patent Application No. 10-2021-0191087, filed on Dec. 29, 2021 in the Korean Intellectual Property Office, the disclosure of which is incorporated herein by reference in its entirety.

BACKGROUND

The present inventive concepts relates to a wafer chuck table and a wafer chuck system.

A plurality of protrusions for supporting a wafer are formed on a surface of a wafer chuck table for gripping the wafer. The plurality of protrusions may be unevenly worn by contact due to loading and unloading of the wafer. Accordingly, it may be difficult to maintain the loaded wafer horizontally, and the precision of a subsequent process may be deteriorated.

SUMMARY

Some example embodiments of the present inventive concepts is to provide a wafer chuck table and a wafer chuck system capable of correcting a step difference between a plurality of protrusions.

According to some example embodiments of the present inventive concepts, a wafer chuck table may include: a center plate having a plurality of first protrusions, each first protrusion of the plurality of first protrusions having an upper end at least partially defining a first reference plane; segmented plates arranged around the center plate, each segmented plate having a plurality of second protrusions, each second protrusion of the plurality of second protrusions having an upper end at least partially defining a second reference plane such that the segmented plates have separate, respective pluralities of second protrusions at least partially defining separate, respective second reference planes; and driving units configured to adjust a respective inclination angle of each of the segmented plates with respect to the center plate so that the first reference plane and the separate, respective second reference planes are coplanar.

According to some example embodiments of the present inventive concepts, a wafer chuck table may include: a center plate having a first surface on which a plurality of first protrusions are arranged; segmented plates arranged around the center plate and having a second surface on which a plurality of second protrusions are arranged and a third surface opposite to the second surface; and driving units configured to press at least one side of the third surface of each of the segmented plates.

According to some example embodiments of the present inventive concepts, a wafer chuck table includes: a center plate having a plurality of first protrusions; first and second segmented plates arranged around the center plate and each having a plurality of second protrusions; and driving units configured to independently adjust respective inclination angles of the first and second segmented plates with respect to the center plate.

According to some example embodiments of the present inventive concepts, a wafer chuck system includes: a center plate having a plurality of first protrusions; segmented plates arranged around the center plate and having a plurality of second protrusions; driving units configured to adjust an inclination angle of each of the segmented plates with respect to the center plate; and a control unit configured to operate the driving units so that an upper end of at least a portion of the plurality of second protrusions is in contact with a reference plane at least partially defined by an upper end of at least a portion of the plurality of first protrusions.

BRIEF DESCRIPTION OF DRAWINGS

The above and other aspects, features, and advantages of the present inventive concepts will be more clearly understood from the following detailed description, taken in conjunction with the accompanying drawings, in which.

Figure 1A:
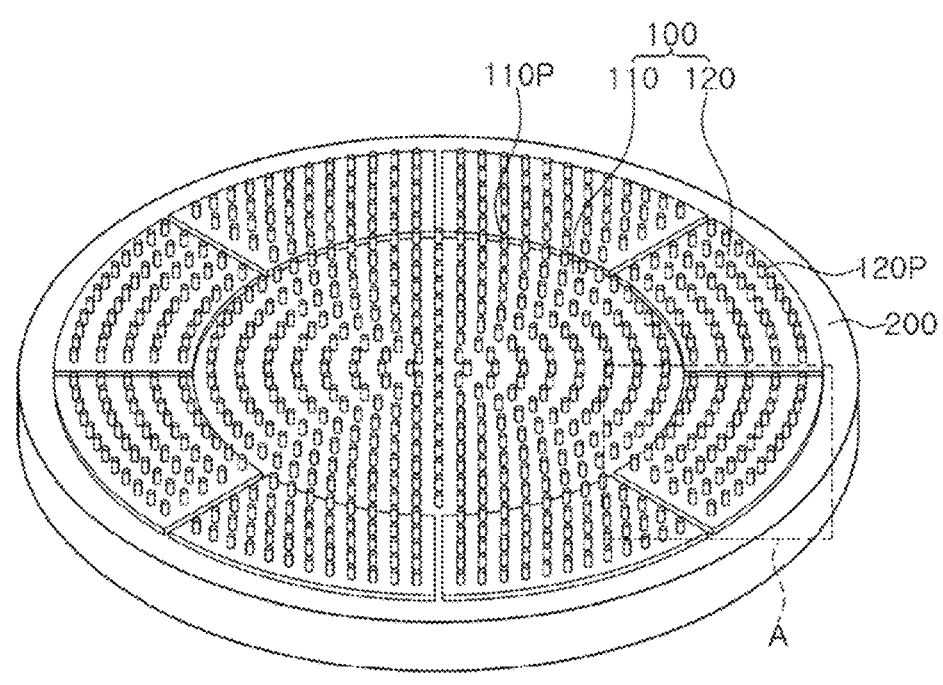
FIG. 1A is a perspective view illustrating a wafer chuck table according to some example embodiments of the present inventive concepts.

3 according to some example embodiments of the present inventive concepts is applied.

DETAILED DESCRIPTION

Hereinafter, some example embodiments of the present inventive concepts will be described with reference to the accompanying drawings.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1B:
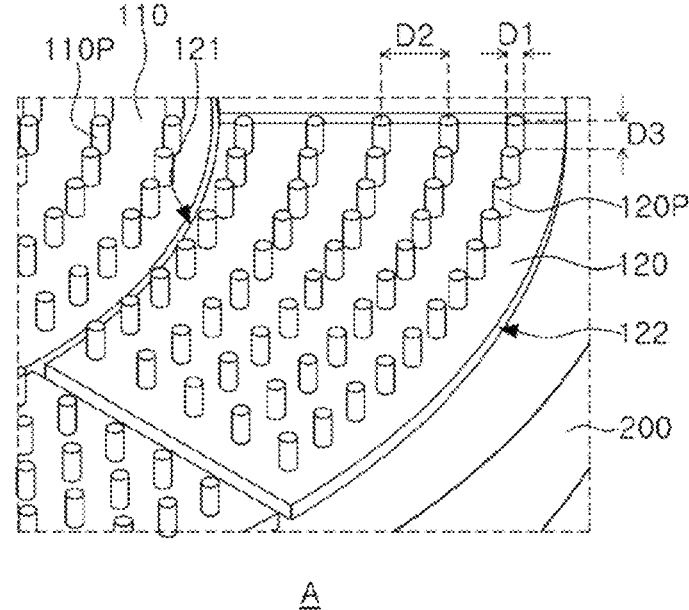
FIG. 1B is a partially enlarged view illustrating region 'A' of FIG. 1A according to some example embodiments of the present inventive concepts.
Figure 1C:
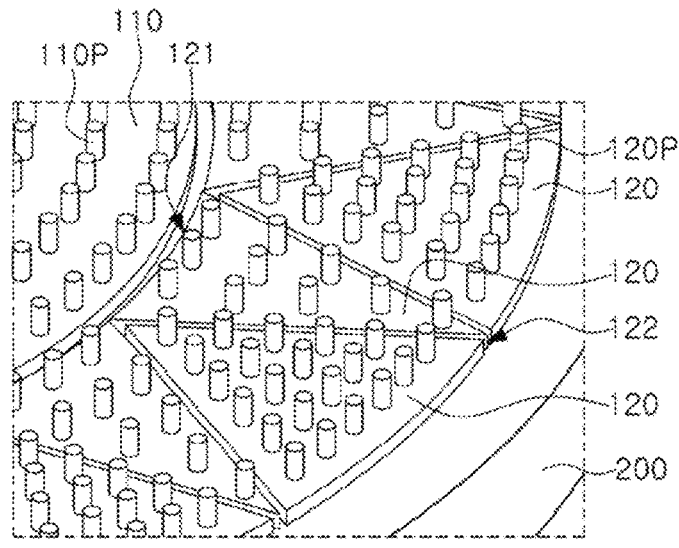
FIG. 1C is a partially enlarged view illustrating segmented plates of a modified example according to some example embodiments of the present inventive concepts.

FIG. 1A is a perspective view illustrating a wafer chuck table 100 according to some example embodiments of the present inventive concepts, FIG. 1B is a partially enlarged view illustrating region 'A' of FIG. 1A according to some example embodiments of the present inventive concepts, and FIG. 1C is a partially enlarged view illustrating segmented plates 120 of a modified example according to some example embodiments of the present inventive concepts.

Referring to FIGS. 1A to 1C, the wafer chuck table 100 according to some example embodiments may include a center plate 110 and a plurality of segmented plates 120. The wafer chuck table 100 may be temporarily seated on a support 200. The center plate 110 and the plurality of segmented plates 120 may include a plurality of first protrusions 110P and a plurality of second protrusions 120P separating a semiconductor wafer from a surface thereof.

The segmented plates 120 may be disposed in a region in which the plurality of second protrusions 120P are more worn than the plurality of first protrusions 110P. The degree of wear of the plurality of second protrusions 120P may be determined by a diameter of the wafer chuck table 100, sizes of the plurality of first and second protrusions 110P and 120P, anisotropy of physical properties of the semiconductor wafer, and the like. Here, the diameter of the wafer chuck table 100 may correspond to a size of the semiconductor wafer, for example, 8 inches, 12 inches, 18 inches, or the like. The plurality of first protrusions 110P and the plurality of second protrusions 120P may have, for example, a diameter D1 in a range of about 0.1 mm to about 2 mm, a center-to-center spacing D2 between about 0.5 mm and about 20 mm, and a height D3 in a range of about 1 μm to about 300 μm, but is not limited thereto. The plurality of first protrusions 110P and the plurality of second protrusions 120P may have the diameter D1, the center-to-center spacing D2, and the height D3 different from the aforementioned numerical ranges according to design.

The center plate 110 may have a disk shape corresponding to the center of the semiconductor wafer, but is not limited thereto. The center plate 110 may be formed in various shapes (e.g., oval, quadrangular, pentagonal, etc.) corresponding to a boundary between a region in which the protrusions are more worn and a region in which the protrusions are less worn. The segmented plates 120 may be separated from each other and surround the circumference of the center plate 110, and may have a polygonal shape including an inner edge 121 adjacent to the circumference of the center plate 110 and an outer edge 122 opposite to the inner edge 121. For example, the inner edge 121 and the outer edge 122 may be curved to correspond to the shape of the semiconductor wafer. The segmented plates 120 may be formed by dividing a ring surrounding the center plate 110 having a center disk shape into a plurality of portions as illustrated in FIGS. 1B and 1C. The segmental plates 120 may have the same shape as each other, but may have different shapes according to some example embodiments. According to wear tendency of the plurality of second protrusions 120P, the shape of the segmented plates 120 may be variously modified, and a larger or smaller number of segmented plates 120 than those illustrated in the drawings may be provided.

A wafer chuck table supports and holds semiconductor wafers in various semiconductor processes for processing the semiconductor wafers. As the semiconductor wafer is repeatedly loaded and unloaded, a plurality of protrusions in contact with the semiconductor wafer are unevenly worn, deteriorating flatness of the semiconductor wafer seated on the wafer chuck table. This may deteriorate film quality formed on the wafer and vertical alignment of a pattern, causing defects due to an overlay of the film quality and pattern and reducing the yield. In particular, the protrusions may be more worn and the film quality and the vertical alignment of the pattern may be deteriorated in a direction toward the edge of the wafer chuck table. Thus, when the wear of the protrusions located on the edge of the wafer chuck table reaches a certain level (about 50 nm or more), the entire wafer chuck table may be replaced.

In the present inventive concepts, the center plate 110 having a plurality of first protrusions 110P may be disposed in the central region of the wafer chuck table 100 in which the protrusions are less worn, and the segmented plates 120 whose inclination angle (e.g., respective inclination angles of the separate segmented plates) with respect to the center plate 110 is adjusted is disposed at the edge of the wafer chuck table 100 in which the protrusions are relatively more worn, thereby correcting a step difference between the plurality of first protrusions 110P and the plurality of second protrusions 120P. For example, when the plurality of second protrusions 120P are worn, the height D3 of the plurality of second protrusions 120P may be progressively reduced from the inner edge 121 to the outer edge 122 of the segmented plates 120. In this case, the segmented plates 120 may have a particular (or, alternatively, predetermined) inclination angle with respect to the center plate 110 so that the uppermost ends of the worn second protrusions 120P are horizontally aligned with the uppermost ends (or upper surfaces) of the plurality of first protrusions 110P. (This will be described below with reference to FIGS. 2 to 3B.) Accordingly, by maintaining the level of the semiconductor wafer seated on the wafer chuck table 100, misalignment of the film qualities and/or patterns sequentially stacked on the semiconductor wafer and corresponding defects may be reduced or minimized and the yield may be improved, thereby configuring the wafer chuck table 100 to enable production of semiconductor devices based on the semiconductor wafer with reduced defects and thus improved reliability and/or performance. In addition, a replacement cycle of the wafer chuck table 100 may be lengthened, thereby reducing the process cost associated with periodically replacing the wafer chuck table 100 due to a reduced frequency for replacement of the wafer chuck table 100.

Figure 2:
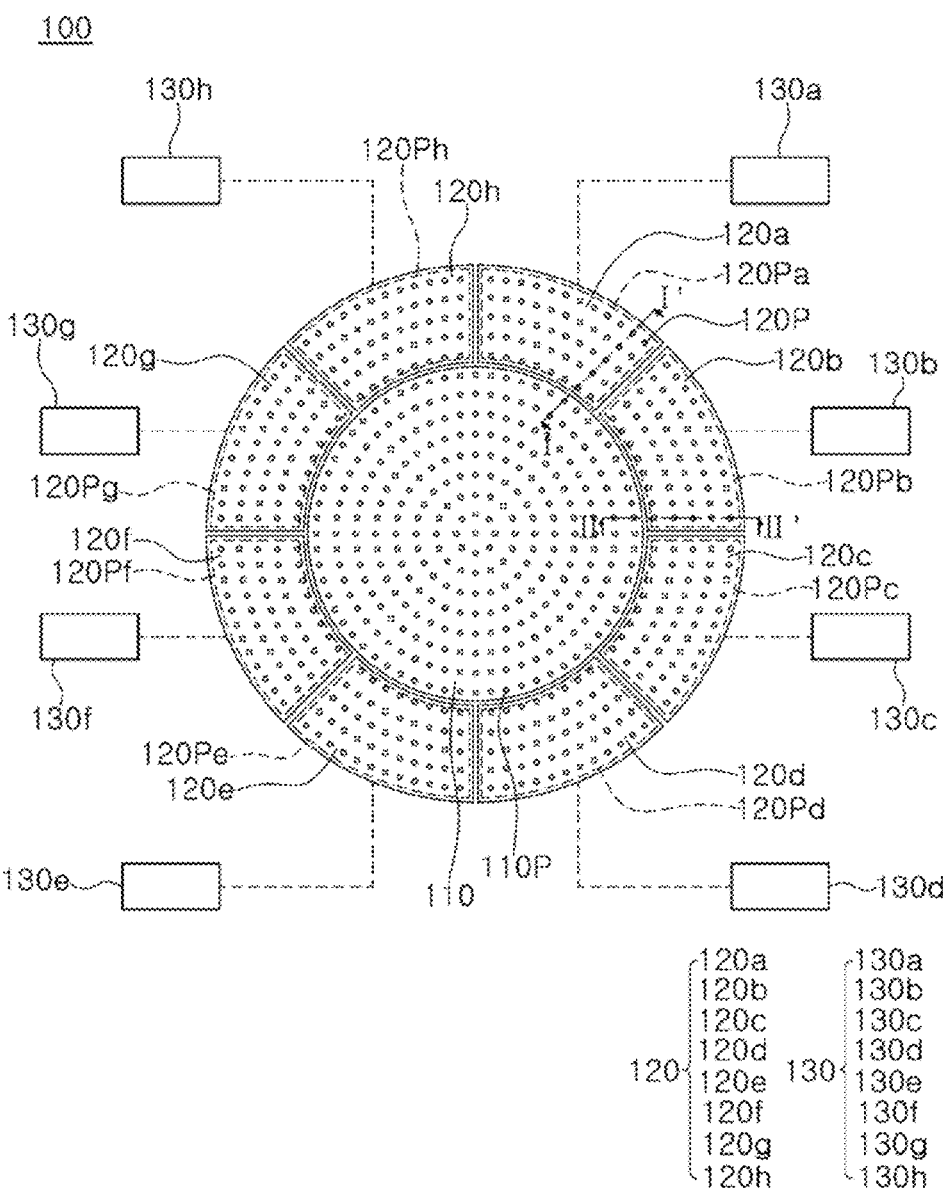
FIG. 2 is a plan view illustrating a wafer chuck table according to some example embodiments of the present inventive concepts.
Figure 3A:
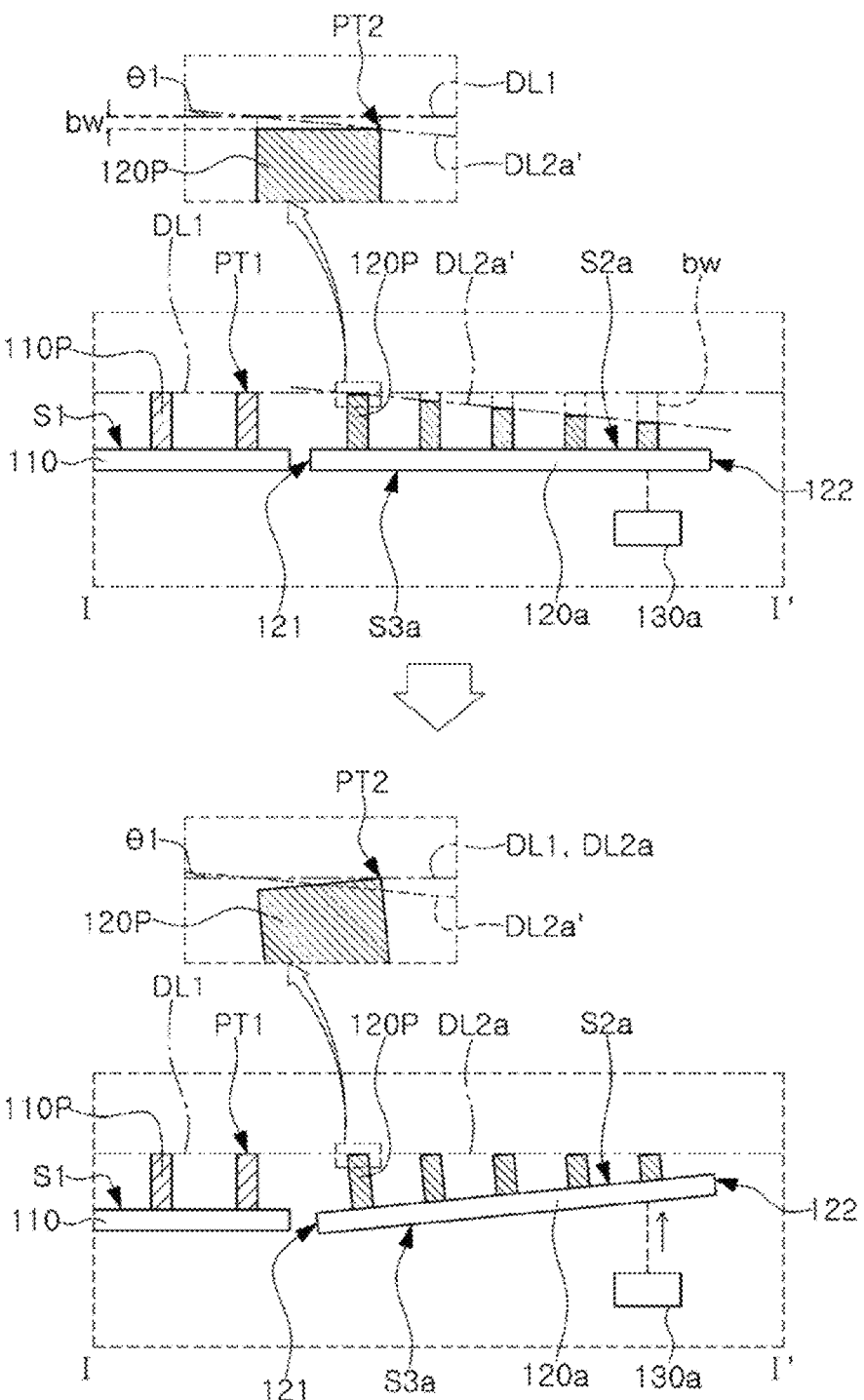
FIG. 3A is a cross-sectional view taken along I-I' of FIG. 2 according to some example embodiments of the present inventive concepts.
Figure 3B:
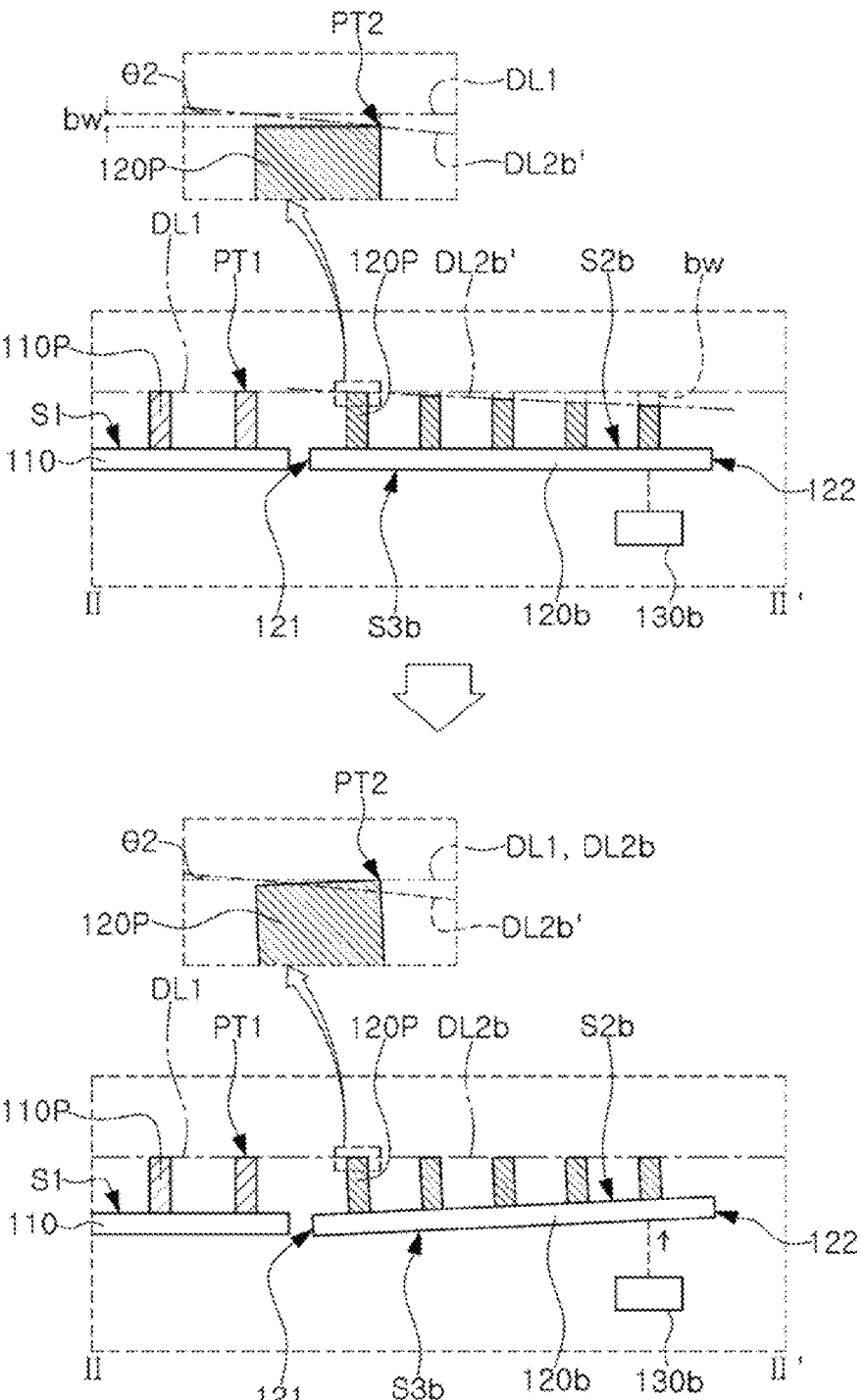
FIG. 3B is a cross-sectional view taken along line II-IF of FIG. 2 according to some example embodiments of the present inventive concepts.

FIG. 2 is a plan view illustrating the wafer chuck table 100 according to some example embodiments of the present inventive concepts, FIG. 3A is a cross-sectional view taken along line I-I' of FIG. 2 according to some example embodiments of the present inventive concepts, and FIG. 3B is a cross-sectional view taken along line II-IF of FIG. 2 according to some example embodiments of the present inventive concepts. FIG. 2 is a top view of the wafer chuck table 100 of FIG. 1A.

Referring to FIG. 2, the wafer chuck table 100 according to some example embodiments may include the center plate 110, the segmented plates 120, and driving units 130. The center plate 110 may have a plurality of first protrusions 110P providing (e.g., having upper surfaces at least partially defining) a first reference plane ('DL1' in FIGS. 3A and 3B) (hereinafter, 'DL1'). Here, the first reference plane DL1 may refer to a plane or a line connecting (e.g., at least partially defined by) an upper end of at least a portion of the plurality of first protrusions 110P aligned on the same plane.

The segmented plates 120 may be disposed around the center plate 110, and may each have a plurality of second protrusions 120P. For example, the segmented plates 120 may include first to eighth segmented plates 120a, 120b, 120c, 120d, 120e, 120f, 120g, and 120h completely surrounding the circumference of the center plate 110. The plurality of second protrusions 120P may be integrated with the corresponding segmented plates 120a, 120b, 120c, 120d, 120e, 120f, 120g, and 120h, respectively, to form first to eighth protrusion groups 120Pa, 120Pb, 120Pc, 120Pd, 120Pe, 120Pf, 120Pg, and 120Ph. The first to eighth protrusion groups 120Pa, 120Pb, 120Pc, 120Pd, 120Pe, 120Pf, 120Pg, and 120Ph may provide (e.g., may have upper surfaces at least partially defining) a plurality of corresponding second reference planes ('DL2' and 'DL2b' in FIGS. 3A and 3B) (hereinafter, 'DL2'). Here, the second reference plane DL2 may refer to a plane or a line connecting (e.g., at least partially defined by) an upper end of at least a portion of the plurality of second protrusions 120P aligned on the same plane. Accordingly, it will be understood that each of the segmented plates 120 may have a separate plurality of second protrusions (e.g., protrusion groups 120Pa, 120Pb, 120Pc, 120Pd, 120Pe, 120Pf, 120Pg, and 120Ph), each second protrusion of each respective plurality of second protrusions having an upper end at least partially defining a second reference plane (e.g., DL2) such that the separate, respective segmented plates 120 (e.g., segmented plates 120a, 120b, 120c, 120d, 120e, 120f, 120g, and 120h) have separate, respective pluralities of second protrusions 120P (e.g., separate, respective protrusion groups 120Pa, 120Pb, 120Pc, 120Pd, 120Pe, 120Pf, 120Pg, and 120Ph) at least partially defining separate, respective second reference planes (e.g., separate, respective second reference planes DL2).

The driving units 130 may be configured to independently adjust an inclination angle of each of the segmented plates 120 (e.g., adjust the separate, respective inclination angles of the separate, respective segmented plates 120) with respect to the center plate 110. For example, the driving units 130 may include first to eighth driving units 130a, 130b, 130c, 130d, 130e, 130f, 130g, and 130h corresponding to the first to eighth segmented plates 120a, 120b, 120c, 120d, 120e, 120f, 120g, and 120h, respectively. That is, the driving units 130 may adjust an inclination angle of each of the segmented plates 120 with respect to the center plate 110 to be different so that the plurality of reference planes DL2 are horizontal to the first reference plane DL1 of the plurality of first protrusions 110P. Hereinafter, planes that are described to be "horizontal" or "horizontally aligned" may be understood to be coplanar or substantially coplanar. The reference plane(s) DL1 and/or DL2 may be defined by sensing the upper ends of the plurality of protrusions 110P and/or 120P through a sensor device, an input device, or the like, each of which may be processed by the control unit 135.

Accordingly, the driving units 130 may be configured to adjust an inclination angle of the segmented plates 120 (e.g., adjust the separate, respective inclination angle of each of the separate, respective segmented plates 120) with respect to the center plate 110 so that the first reference plane DL1 and the separate, respective second reference planes DL2 defined by the separate, respective pluralities of second protrusions 120P (e.g., separate, respective protrusion groups) of the separate, respective segmented plates 120 are coplanar. As a result, by being configured to adjust the respective inclination angles of the segmented plates 120 so that the separate, respective second reference planes DL2 are caused to be coplanar to the first reference plane DL1, all or substantially all of the projections of the wafer chuck table 100 may contact (e.g., at least partially define) a same coplanar reference plane (e.g., the first reference plane DL1) upon which a semiconductor wafer may be supported by the wafer chuck table 100 (e.g., flatness of the semiconductor wafer on the wafer chuck table 100 may be maintained and/or enabled due to being supported on protrusions defining a single reference plane which may be the same as the first reference plane DL1). As a result, a misalignment of the film qualities and/or patterns sequentially stacked on the semiconductor wafer being supported by the wafer chuck table 100 and corresponding defects may be reduced or minimized and the yield may be improved, thereby configuring the wafer chuck table 100 to enable production of semiconductor devices based on the semiconductor wafer with reduced defects and thus improved reliability and/or performance, thereby resulting in the wafer chuck table 100 having improved performance and/or reliability in enabling formation of devices (e.g., patterns) thereon with reduced or no defects. In addition, a replacement cycle of the wafer chuck table 100 may be lengthened as the adjustment of the inclination angle(s) of the segmented plates 120 may enable the wafer chuck table 100 to partially or completely compensate for wear of second protrusions extending from one or more of the segmented plates 120 upon the reference plane(s) DL1 and/or DL2 instead of the wafer chuck table 100 being replaced, thereby reducing the process cost associated with periodically replacing the wafer chuck table 100 due to a reduced frequency for replacement of the wafer chuck table 100, and thus resulting in an improved performance and/or reliability of the wafer chuck table 100 in being configured to enable formation of devices (e.g., patterns) thereon with reduced or no defects for a longer period of time without replacement of the wafer chuck table 100.

Hereinafter, an interaction between the segmented plates 120 and the driving units 130 will be described with reference to FIGS. 3A and 3B.

Referring to FIG. 3A, the center plate 110 may have a first surface S1 from which a plurality of first protrusions 110P protrude, and the first segmented plate 120a may have a second surface S2a from which a plurality of second protrusions 120P protrude and a third surface S3a opposite to the second surface S2a. An upper end PT1 of at least a portion of the plurality of first protrusions 110P may be aligned to be in contact with (e.g., at least partially defining) the first reference plane DL1. At least a portion of the plurality of second protrusions 120P may be in a worn state, and an upper end PT2 of at least a portion of the worn second protrusions 120P may be aligned to be in contact with (e.g., at least partially defining) the second preliminary reference plane DL2a'. Here, the "second preliminary reference plane DL2a'" refers to the "second reference plane DL2a" before being horizontally aligned with the first reference plane DL1, and thus may be defined similarly to the "second reference plane DL2a". As an example, a worn portion bw of the plurality of second protrusions 120P may increase toward the outer edge 122. That is, the plurality of second protrusions 120P may have a height less (e.g., smaller) than the plurality of first protrusions 110P and may have a smaller height in a direction toward the outer edge 122. Accordingly, when the first surface S1 of the center plate 110 and the second surface S2a of the first segmented plate 120a are horizontally aligned, the second preliminary reference plane DL2a' may be inclined at a first angle $\theta 1$ with respect to the first reference plane DL1.

The first driving unit 130a may press at least one side of the third surface S3a of the first segmented plate 120a to adjust the inclination angle of the first segmented plate 120a with respect to the center plate 110 so that the upper end of at least a portion of the plurality of second protrusions 120P is in contact with the first reference plane DL1. For example, the first driving unit 130a may adjust the inclination angle of the first segmented plate 120a by pressing one side adjacent to the outer edge 122 of the first segmented plate 120a. Accordingly, when the first reference plane DL1 and the second reference plane DL2a are horizontally aligned (e.g., are coplanar or substantially coplanar), the first segmented plate 120a may have a first inclination angle with respect to the center plate 110. Here, the first inclination angle may be understood as an angle between the first surface S1 and the second surface S2a of the first segmented plate 120a. For example, when the first reference plane DL1 and the second reference plane DL2a are horizontally aligned, the first inclination angle may be increased by a first angle $\theta 1$ between the first reference plane DL1 and the second preliminary reference plane DL2a'.

Referring to FIG. 3B, the second segmented plate 120b may have a second surface S2b from which the plurality of second protrusions 120P protrude and a third surface S3b opposite to the second surface S2b. At least a portion of the plurality of second protrusions 120P may be in a worn state, and upper ends PT2 of at least a portion of the worn second protrusions 120P may be aligned to be in contact with the second preliminary reference plane DL2b'. As an example, the plurality of second protrusions 120P of the second segmented plate 120b may be less worn than the plurality of second protrusions 120P of the first segmented plate 120a illustrated in FIG. 3A. Accordingly, when the first surface S1 of the center plate 110 and the second surface S2b of the second segmented plate 120b are horizontally aligned, the second preliminary reference plane DL2b' may be inclined at an angle of a second angle $\theta 2$ smaller than the first angle $\theta 1$ of FIG. 3A with respect to the first reference plane DL1.

The second driving unit 130b may press at least one side of the third surface S3b of the second segmented plate 120b to adjust an inclination angle of the second segmented plate 120b with respect to the center plate 110. For example, the second driving unit 130b may adjust the inclination angle of the second segmented plate 120b by pressing one side adjacent to the outer edge 122 of the second segmented plate 120b. Accordingly, when the first reference plane DL1 and the second reference plane DL2b are horizontally aligned, the second segmented plate 120b may have a second inclination angle with respect to the center plate 110. Here, the second inclination angle may be understood as an angle between the first surface S1 and the second surface S2b of the second segmented plate 120b. For example, when the first reference plane DL1 and the second reference plane DL2b are horizontally aligned, the second inclination angle may be increased by the second angle θ2 between the first reference plane DL1 and the second preliminary reference plane DL2b'.

As such, the driving units 130 may independently adjust the inclination angle of each of the first to eighth segmented plates 120a, 120b, 120c, 120d, 120e, 120f, 120g, and 120h with respect to the center plate 110. That is, the inclination angle of each of the first to eighth segmented plates 120a, 120b, 120c, 120d, 120e, 120f, 120g, and 120h with respect the center plate 110 may be different according to a worn state of the plurality of second protrusions 120P. For example, depending on the worn state of the plurality of second protrusions 120P illustrated in FIG. 3B, the second segmented plate 120b may have the second inclination angle smaller or greater than the first inclination angle of the first segmented plate 120a of FIG. 3A.

Figure 4:
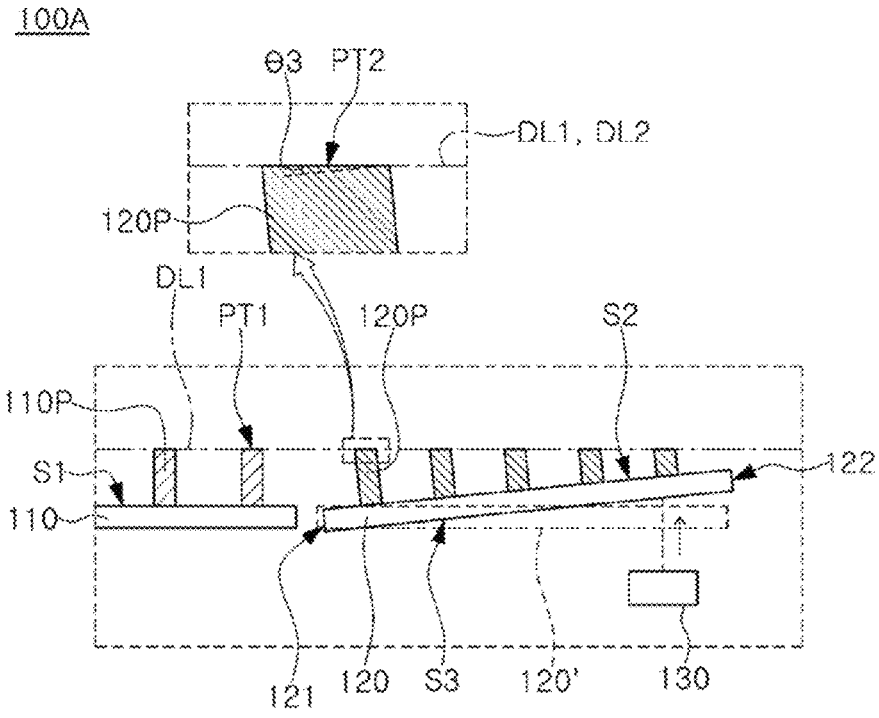
FIG. 4 is an enlarged cross-sectional view illustrating a partial region of a wafer chuck table according to some example embodiments of the present inventive concepts.

FIG. 4 is an enlarged cross-sectional view illustrating a partial region of a wafer chuck table 100A according to some example embodiments of the present inventive concepts.

Referring to FIG. 4, the wafer chuck table 100A according to some example embodiments may have characteristics the same as or similar to those described above with reference to FIGS. 1 to 3B, except that the upper end PT2 of each of the plurality of second protrusions 120P is an inclined surface inclined toward the outer edge 122 of the segmented plates 120. In some example embodiments, the wafer chuck table 100A may include a plurality of second protrusions 120P worn by contact with the semiconductor wafer. In particular, when loading and unloading of the semiconductor wafer is repeated, at least a portion of the second protrusions 120P in contact with the edge of the semiconductor wafer may be partially worn out to be inclined so that an upper surface thereof is inclined toward the outer edge 122 of the segmented plates 120. For example, the upper end PT2 of at least a portion of the plurality of second protrusions 120P may be inclined at the third angle θ3 with respect to the second surface S2 of the segmented plates 120. Alternatively, when the preliminary segmented plates 120' are horizontally aligned with the center plate 110, the upper end PT2 of at least a portion of the plurality of second protrusions 120P may be inclined at the angle θ3 with respect to the first reference plane DL1. Here, the "preliminary segmented plates 120'" refers to the "segmented plates 120" before the inclination angle with respect to the center plate 110 is adjusted.

That is, in some example embodiments, when the first reference plane DL1 and the second reference plane DL2 are horizontally aligned, the inclined surfaces (or the upper ends PT2) of the plurality of second protrusions 120P contact the semiconductor wafer, and thus, the level of the semiconductor wafer may be more stably maintained.

Figure 5:
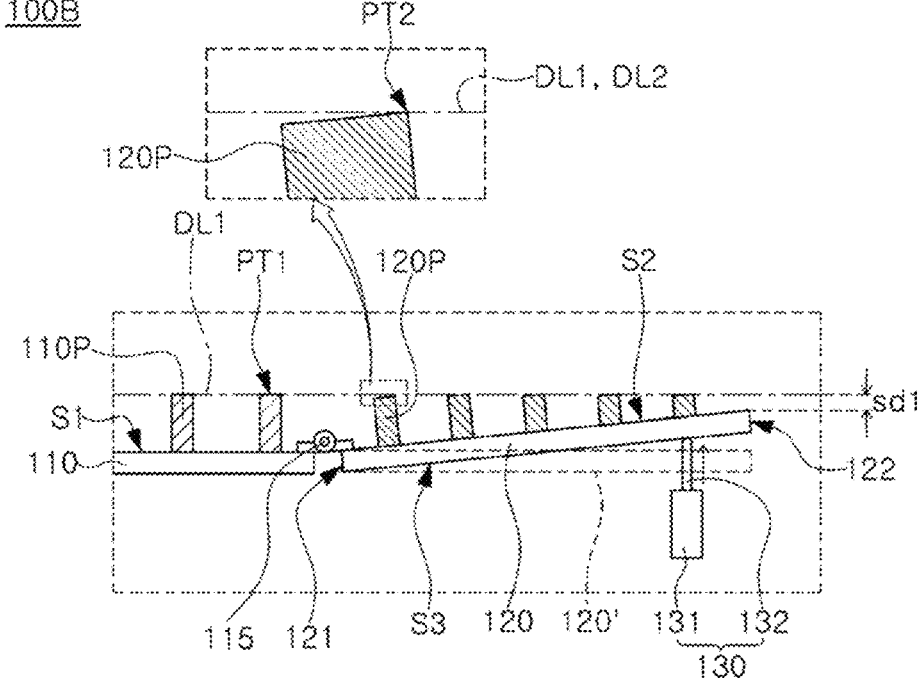
FIG. 5 is an enlarged cross-sectional view illustrating a partial region of a wafer chuck table according to some example embodiments of the present inventive concepts.

FIG. 5 is an enlarged cross-sectional view illustrating a partial region of a wafer chuck table 100B according to some example embodiments of the present inventive concepts.

Referring to FIG. 5, the wafer chuck table 100B according to some example embodiments may have characteristics the same as or similar to those described above with reference to FIGS. 1 to 4, except that the wafer chuck table 100B includes at least one coupling member 115 coupling the center plate 110 and the segmented plates 120 to each other. The wafer chuck table 100B of some example embodiments may align the upper ends PT2 of at least a portion of the plurality of second protrusions 120P having a height decreasing toward the outer edge 122 to be aligned with the first reference plane DL1 using the coupling members 115 disposed on the inner edge 121 of each of the segmented plates 120 and the outer edge 122 of each of the segmented plates 120. The upper end PT1 of at least a portion of the plurality of first protrusions 110P and the upper end PT2 of at least a portion of the plurality of second protrusions 120P may be coplanar.

The coupling members 115 may hinge-couple the center plate 110 and the inner edge 121 of each of the segmented plates 120. For example, the driving units 130 may include at least one linear actuator 131 disposed to be adjacent to the outer edge 122 of the segmented plates 120 and configured to adjust a spacing distance sd1 of the outer edge 122 with respect to the first reference plane DL1 and at least one lifting shaft 132 lifted and lowered according to the driving of the linear actuator 131. The lifting shaft 132 may be configured to adjust the spacing distance sd1 of the outer edge 122 by pressing one side of the segmented plates 120. The linear actuator 131 may include, for example, a piezo-electric actuator, but is not limited thereto. According to some example embodiments, the linear actuator 131 may include a voice coil actuator (VCA), etc.

Figure 6A:
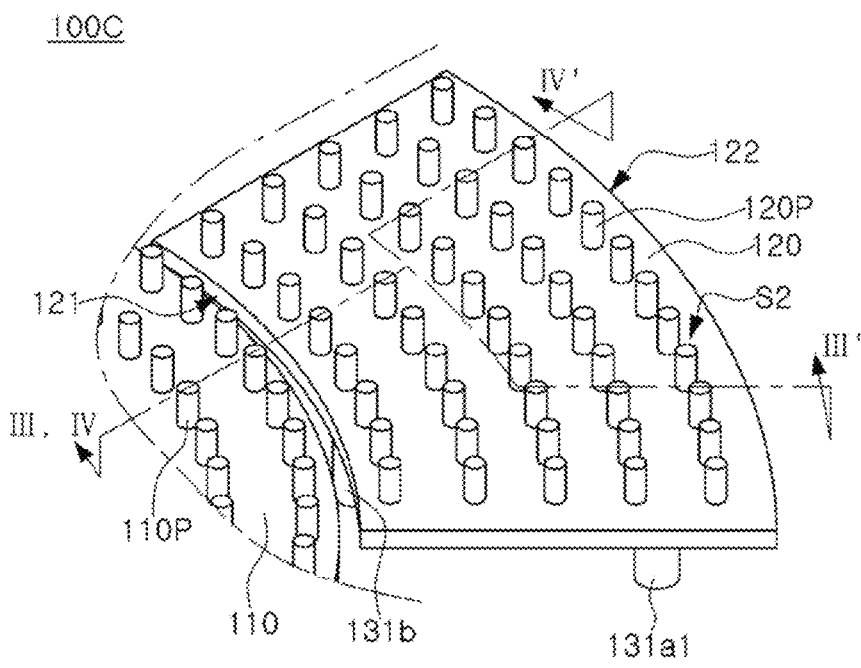
FIGS. 6A and 6B are perspective views illustrating partial regions of a wafer chuck table in different directions according to some example embodiments of the present inventive concepts.
Figure 6B:
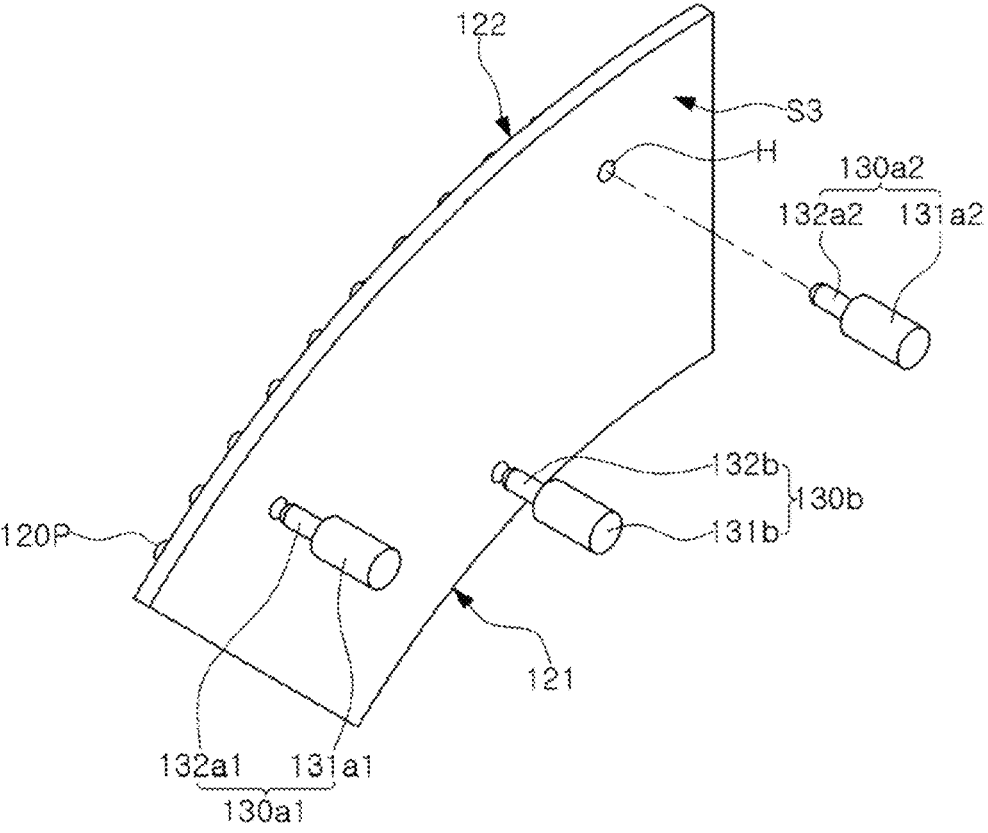
Figure 7A:
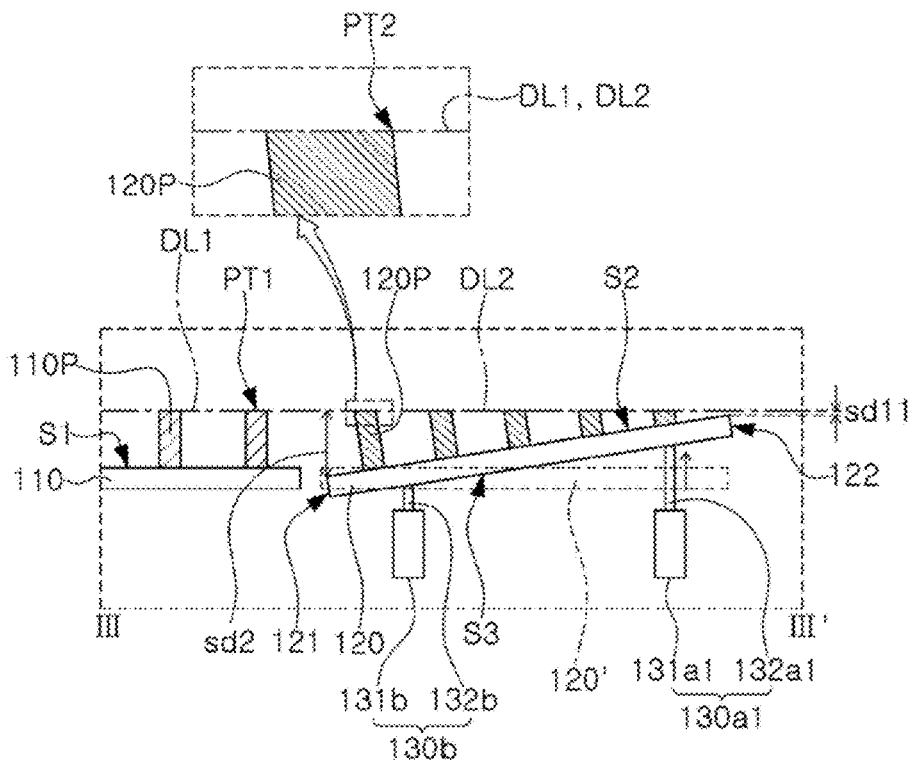
FIG. 7A is a cross-sectional view taken along line of FIG. 6A according to some example embodiments of the present inventive concepts.
Figure 7B:
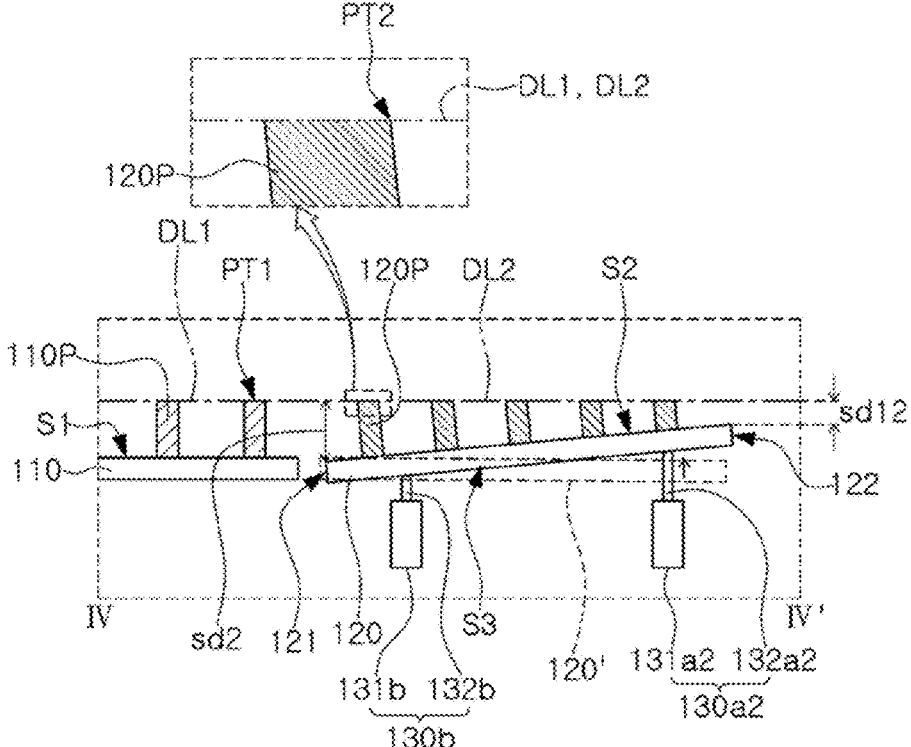
FIG. 7B is a cross-sectional view taken along line IV-IV' of FIG. 6A according to some example embodiments of the present inventive concepts.

FIGS. 6A and 6B are perspective views illustrating partial regions of a wafer chuck table 100C in different directions according to some example embodiments of the present inventive concepts, FIG. 7A is a cross-sectional view taken along line of FIG. 6A according to some example embodiments of the present inventive concepts, and FIG. 7B is a cross-sectional view taken along line IV-IV' of FIG. 6A according to some example embodiments of the present inventive concepts.

Referring to FIGS. 6A and 6B, the wafer chuck table 100C of some example embodiments may have characteristics the same as or similar to those described above with reference to FIGS. 1 to 3B, except that the wafer chuck table 100C includes at least one first linear actuator 131a1 and 131a2 and at least one second linear actuator 131b. For example, the wafer chuck table 100C of some example embodiments may include at least one first driving unit 130a1 and 130a2 disposed to be adjacent to the outer edge 122 of the segmented plates 120 and at least one second driving unit 130b disposed to be adjacent to the inner edge 121 of the segmented plates 120. The first driving units 130a1 and 130a2 and the second driving unit 130b may include linear actuators 131a1, 131a2, and 131b and lifting shafts 132a1, 132a2, and 132b, respectively. In the drawing, the linear actuators 131a1, 131a2, and 131b are illustrated to correspond to the number of the lifting shafts 132a1, 132a2, and 132b, respectively, but according to some example embodiments, a less (e.g., smaller) number (e.g., quantity) of linear actuators than the number of the lifting shafts may also be provided (refer to the example embodiments shown in FIG. 8).

The segmented plates 120 have recesses H in which the at least one first lifting shaft 132a1 and 132a2 and at least one second lifting shaft 132b are accommodated, respectively. For example, the segmented plates 120 and the first and second lifting shafts 132*a*1, 132*a*2, and 132*b* may be coupled to each other in a ball joint structure.

The number of the first driving units 130*a*1 and 130*a*2 and the second driving unit 130*b* is not particularly limited, and a larger number of first driving units 130*a*1 and 130*a*2 and second driving unit 130*b* than those illustrated in the drawings may be provided. Although two first driving units 130*a*1 and 130*a*2 and one second driving unit 130*b* are illustrated in the drawing, a relatively larger number of second driving units 130*b* may be provided according to some example embodiments. The first driving units 130*a*1 and 130*a*2 may be configured to adjust the distance of the outer edge 122 with respect to the first reference plane ('DL1' in FIGS. 7A and 7B), and the second driving unit 130*b* may be configured to adjust the distance of the inner edge 121 with respect to the first reference plane ('DL1' in FIGS. 7A and 7B). Each of the first driving units 130*a*1 and 130*a*2 and the second driving unit 130*b* may be operated independently.

The wafer chuck table 100C of some example embodiments may align the upper end PT2 of at least a portion of the plurality of second protrusions 120P to be aligned with the first reference surface DL1 more precisely using the first linear actuators 131*a*1 and 131*a*2 and second linear actuator 131*b* respectively disposed on the inner edge 121 and the outer edge 122 of the segmented plates 120. Accordingly, the level of the semiconductor wafer seated on the wafer chuck table 100C may be more effectively maintained. As an example, the wafer chuck table 100C may include a 1-1-th linear actuator 131*a*1 and a 1-2-th linear actuator 131*a*2 adjacent to the outer edge 122, and a second linear actuator 131*b* adjacent to the inner edge 121. Hereinafter, an interaction between the segmented plates 120, the first linear actuators 131*a*1 and 131*a*2 and the second linear actuator 131*b* will be described with reference to FIGS. 7A and 7B.

Referring to FIG. 7A, the segmented plates 120 may have a second surface S2 from which the plurality of second protrusions 120P protrude and a third surface S3 opposite to the second surface S2. At least a portion of the plurality of second protrusions 120P may be in a worn state. For example, the plurality of second protrusions 120P may have a lower height than the plurality of first protrusions 110P, and may have a height decreasing toward the outer edge 122. The 1-1-th lifting shaft 132*a*1 and the second lifting shaft 132*b* may press at least both sides of the third surface S3 of the segmented plates 120 by the 1-1-th linear actuator 131*a*1 and the second linear actuator 131*b* to adjust an inclination angle of the segmented plates 120 with respect to the center plate 110 so that the upper end PT2 of at least a portion of the plurality of second protrusions 120P is in contact with the first reference plane DL1. For example, the 1-1-th lifting shaft 132*a*1 may adjust a 1-1-th spacing distance sd11 of the outer edge 122 with respect to the first reference plane DL1 by pressing one side adjacent to the outer edge 122 and adjust a second spacing distance sd2 of the inner edge 121 with respect to the first reference plane DL1 by pressing one side adjacent to the inner edge 121. Since the 1-1-th linear actuator 131*a*1 and the second linear actuator 131*b* independently operate, the 1-1-th spacing distance sd11 and the second spacing distance sd2 may be different from each other.

Referring to FIG. 7B, the 1-2-th lifting shaft 132*a*2 and the second lifting shaft 132*b* may adjust an inclination angle of the segmented plates 120 with respect to the center plate 110 so that the upper end PT2 of at least a portion of the plurality of second protrusions 120P comes into contact with the first reference plane DL1, by pressing at least both sides of the third surface S3 of the segmented plates 120. For example, the 1-2-th lifting shaft 132*a*2 may adjust a 1-2-th spacing distance sd12 of the outer edge 122 with respect to the first reference plane DL1 by pressing one side adjacent to the outer edge 122 and adjust a second spacing distance sd2 of the inner edge 121 with respect to the first reference plane DL1 by pressing one side adjacent to the inner edge 121 of the second lifting shaft 132*b*. Since the 1-2-th linear actuator 131*a*2 and the second linear actuator 131*b* operate independently, the 1-2-th spacing distance sd12 and the second spacing distance sd2 may be different from each other. In addition, since the 1-2-th linear actuator 131*a*2 and the 1-1-th linear actuator 131*a*1 of FIG. 7A also operate independently, the 1-1-th spacing distance sd11 and the 1-2-th spacing distance sd12 may be adjusted to be difference to each other according to a worn state of the plurality of second protrusions 120P.

In this manner, the spacing distance of each of the segmented plates 120 with respect to the first reference plane DL1 may be locally adjusted using the at least three driving units 130*a*1 and 130*a*2, and 130*b*. That is, the spacing distance of the segmented plate 120 with respect to the first reference plane DL1 may be formed to be different in at three or more points depending on the worn state of the plurality of second protrusions 120P within one segmented plate 120.

Figure 8:
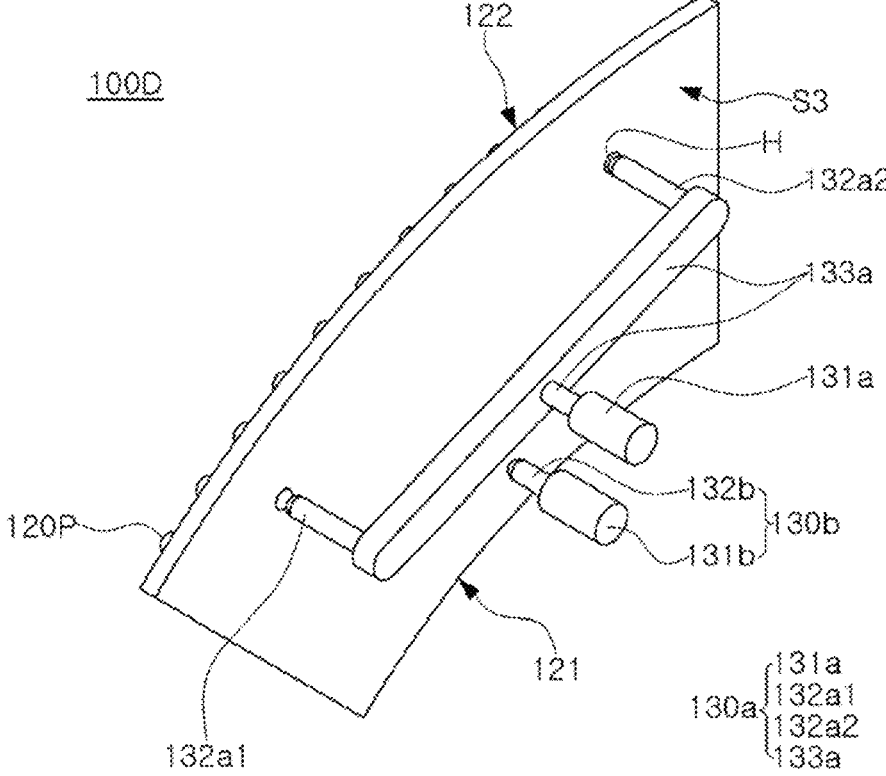
FIG. 8 is a perspective view illustrating a partial region of a wafer chuck table according to some example embodiments of the present inventive concepts.
Figure 9:
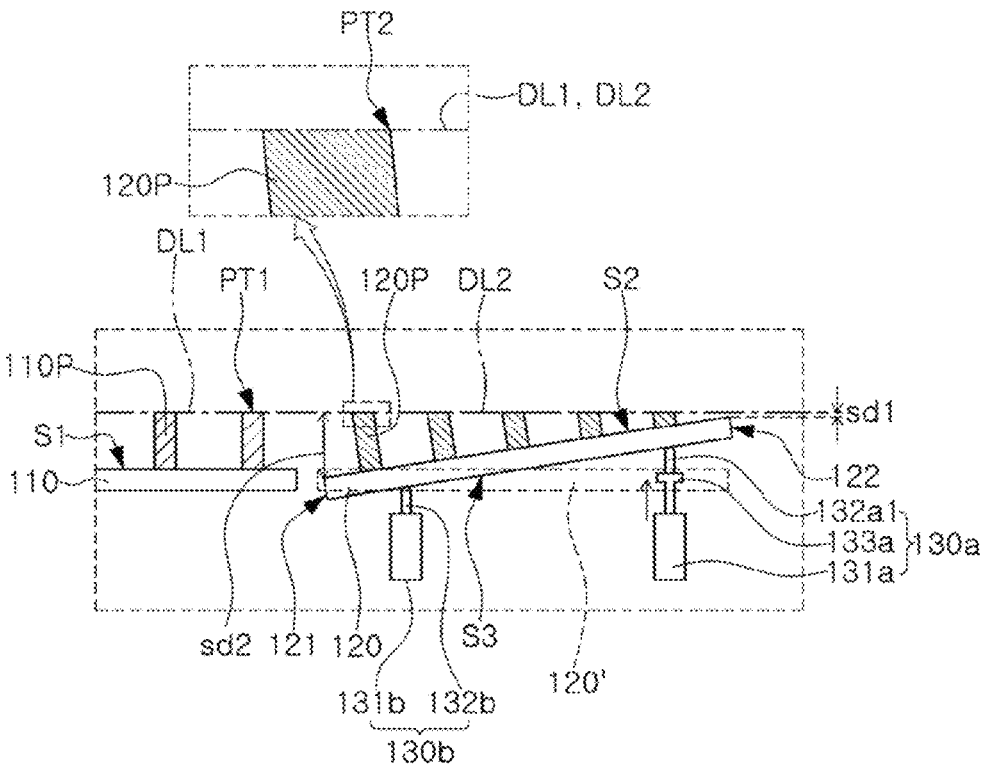
FIG. 9 is a side view illustrating one side of the wafer chuck table of FIG. 8 according to some example embodiments of the present inventive concepts.

FIG. 8 is a perspective view illustrating a partial region of a wafer chuck table 100D according to some example embodiments of the present inventive concepts, and FIG. 9 is a side view illustrating one side of the wafer chuck table 100D of FIG. 8 according to some example embodiments of the present inventive concepts. FIG. 8 illustrates a partial region of the wafer chuck table 100D corresponding to FIG. 6B, and FIG. 9 illustrates a partial region of the wafer chuck table 100D corresponding to FIG. 7A.

Referring to FIGS. 8 and 9, the wafer chuck table 100D of some example embodiments may have characteristics the same as or similar to those described above with reference to FIGS. 6A to 7B, except that the wafer chuck table 100D further includes a connection member 133*a* for connecting two or more lifting shafts 132*a*1 and 132*a*2 and one first linear actuator 131*a*. In some example embodiments, the one first linear actuator 131*a* may simultaneously transmit a driving force to the 1-1-th lifting shaft 132*a*1 and the 1-2-th lifting shaft 132*a*2 through the connection member 133*a*. For example, as illustrated in FIG. 9, the 1-1-th lifting shaft 132*a*1 and the second lifting shaft 132*b* may adjust an inclination angle of the segmented plates 120 with respect to the center plate 110 so that the upper end PT2 of at least a portion of the plurality of second protrusions 120P is in contact with the first reference plate DL1 by pressing at least both sides of the third surface S3 of the segmented plates 120 by the one first linear actuator 131*a* and the second linear actuator 131*b*. At the same time, the 1-1-th lifting shaft 132*a*1 and the 1-2-th lifting shaft 132*a*2 connected to the connection member 133*a* may simultaneously press one side of the third surface S3 of the segmented plates 120. In some example embodiments, unlike some example embodiments, including the example embodiments shown in FIGS. 6A to 7B, the amounts of change in the spacing distances sd1 of the outer edge 122 by the 1-1-th lifting shaft 132*a*1 and the 1-2-th lifting shaft 132*a*2 may be substantially the same.

Figure 10:
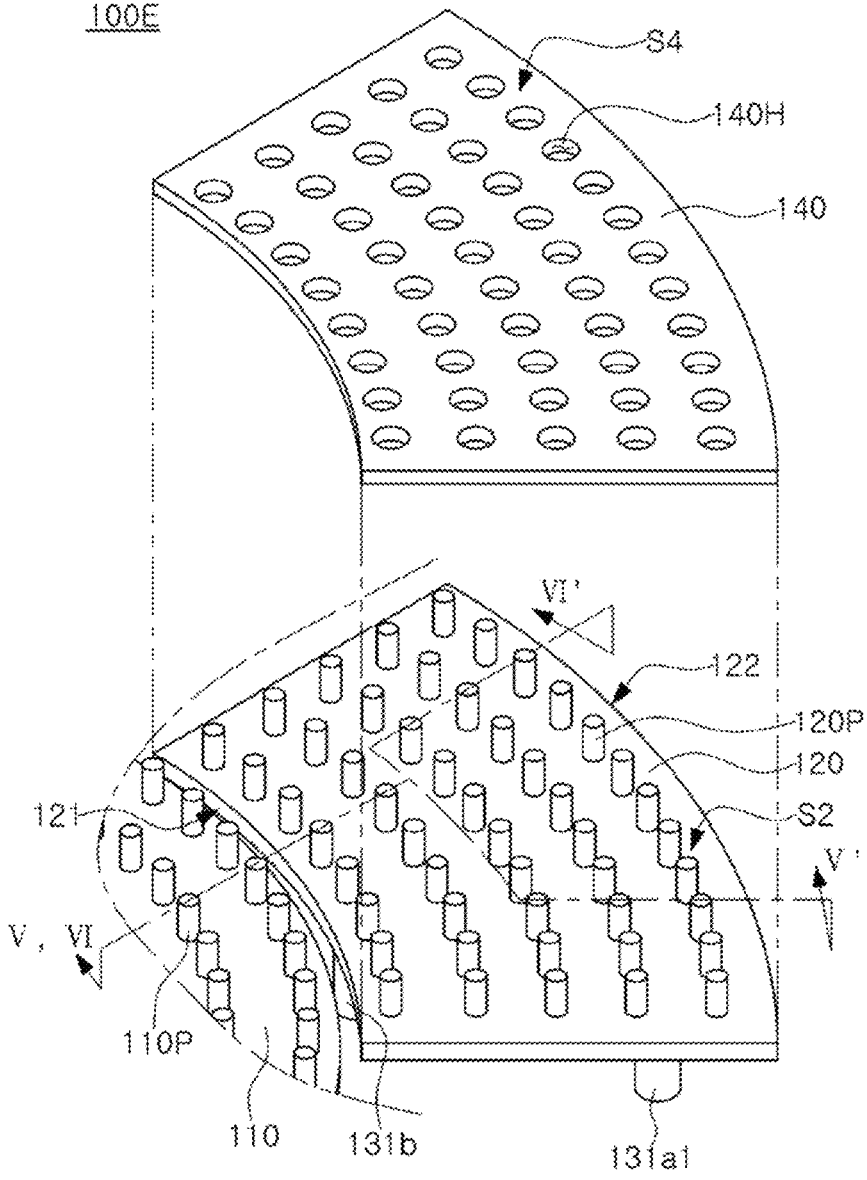
FIG. 10 is a perspective view illustrating a partial region of a wafer chuck table according to some example embodiments of the present inventive concepts.
Figure 11A:
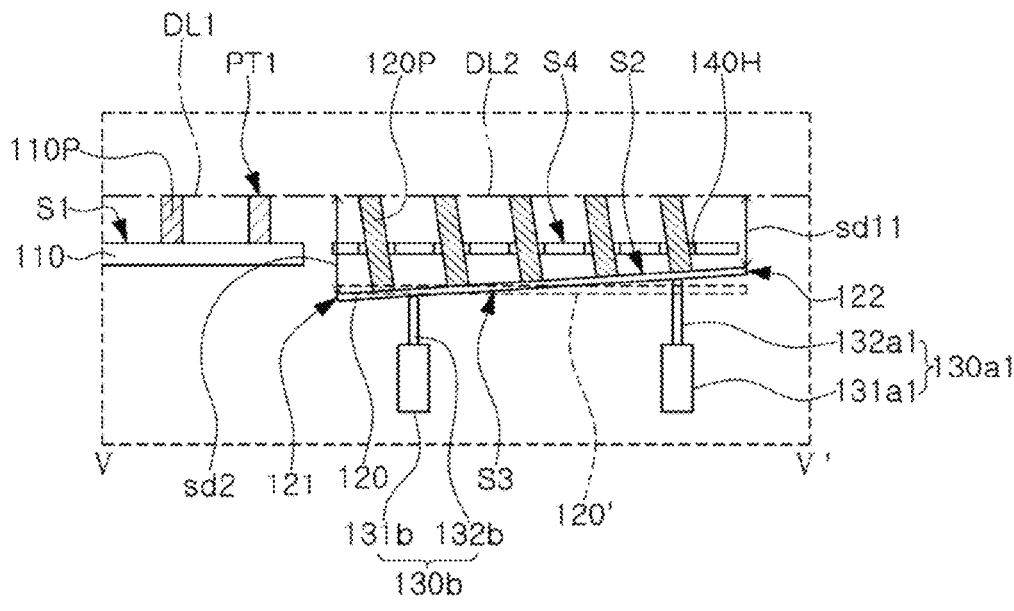
FIG. 11A is a cross-sectional view taken along line V-V' of FIG. 10 according to some example embodiments of the present inventive concepts.
Figure 11B:
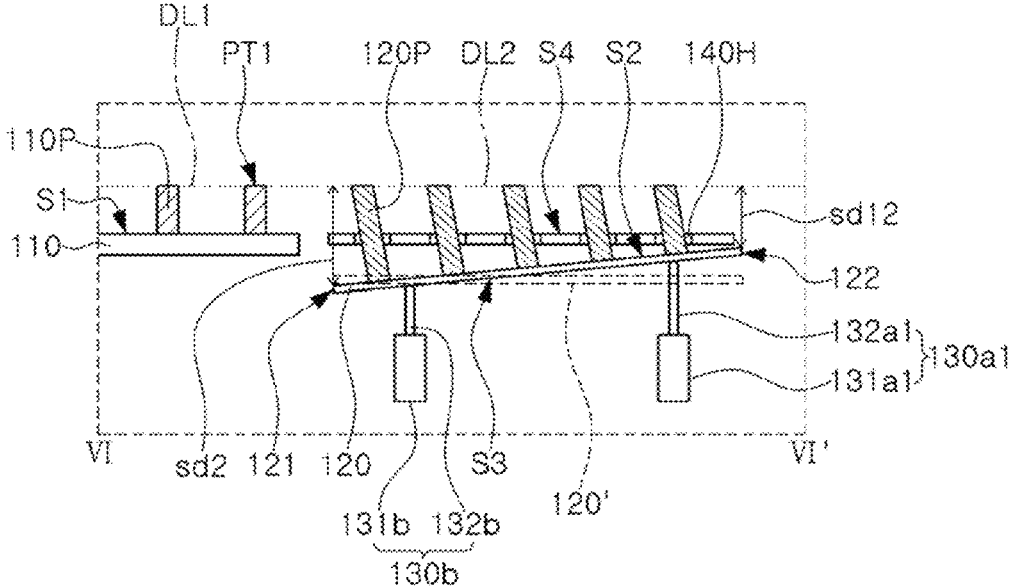
FIG. 11B is a cross-sectional view taken along line VI-VI' of FIG. 10 according to some example embodiments of the present inventive concepts.

FIG. 10 is a perspective view illustrating a partial region of a wafer chuck table 100E according to some example embodiments of the present inventive concepts, FIG. 11A is a cross-sectional view taken along line V-V' of FIG. 10 according to some example embodiments of the present inventive concepts, and FIG. 11B is a cross-sectional view taken along line VI-VI' of FIG. 10 according to some example embodiments of the present inventive concepts.

Referring to FIG. 10, the wafer chuck table 100E according to some example embodiments may have characteristics the same as or similar to those described above with reference to FIGS. 6A to 9, except that the wafer chuck table 100E includes the cover plates 140 respectively disposed on the segmented plates 120. For example, the wafer chuck table 100E of some example embodiments may further include the cover plates 140 including a plurality of through holes 140H, through which the plurality of second protrusions 120P pass, and an upper surface (or a 'fourth surface') S4, which is horizontal (e.g., coplanar or substantially coplanar) to the first surface S1 of the center plate 110, from which the plurality of second protrusions 120P protrude. In some example embodiments, even when the first reference plane (DU' of FIGS. 11A and 11B) and a second reference plane ('DL2' of FIGS. 11A and 11B) are aligned horizontally by the first driving units 130a1 and 130a2 and the second driving unit 130b, the fourth surface S4 of the cover plates 140 may be aligned to be horizontal with respect to the first surface S1 of the center plate 110. Hereinafter, an interaction between the segmented plates 120 protected by the cover plates 140 and the first linear actuators 131a1 and 131a2 and the second linear actuator 131b will be described with reference to FIGS. 11A and 11B.

Referring to FIG. 11A, the plurality of second protrusions 120P may pass through the through holes 140H of the cover plates 140 and protrude onto the fourth surface S4. At least a portion of the plurality of second protrusions 120P may be in a worn state. For example, the 1-1-th lifting shaft 132a1 may press one side adjacent to the outer edge 122 by the 1-1-th linear actuator 131a1 to adjust the 1-1-th spacing distance sd11 with respect to the first reference plane DL1, and the second lifting shaft 132b may press one side adjacent to the inner edge 121 by the second linear actuator 131b to adjust the second spacing distance sd2 of the inner edge 121 with respect to the first reference plane DL1. Since the 1-1-th linear actuator 131a1 and the second linear actuator 131b operate independently, the 1-1-th spacing distance sd11 and the second spacing distance sd2 may be different from each other.

Referring to FIG. 11B, the 1-2-th lifting shaft 132a2 and the second lifting shaft 132b may press at least both sides of the third surface S3 of the segmented plates 120 by the 1-2-th linear actuator 131a2 and the second linear actuators 131b to adjust an inclination angle of the segmented plates 120 with respect to the center plate 110 so that the upper end PT2 of at least a portion of the plurality of second protrusions 120P protruding through the through holes 140H of the cover plates 140 is in contact with the first reference plane DL1. For example, the 1-2-th lifting shaft 132a2 may adjust the 1-2-th spacing distance sd12 of the outer edge 122 with respect to the first reference plane DL1 by pressing one side adjacent to the outer edge 122 and, the second lifting shaft 132b may adjust the second spacing distance sd2 of the inner edge 121 with respect to the first reference plane DL1 by pressing one side adjacent to the inner edge 121. Since the 1-2-th linear actuator 131a2 and the 1-1-th linear actuator 131a1 of FIG. 7A also operate independently, the 1-1-th spacing distance sd11 and the 1-2-th spacing distance sd12 may be adjusted to be different from each other depending on a worn state of the plurality of second protrusions 120P.

Figure 12:
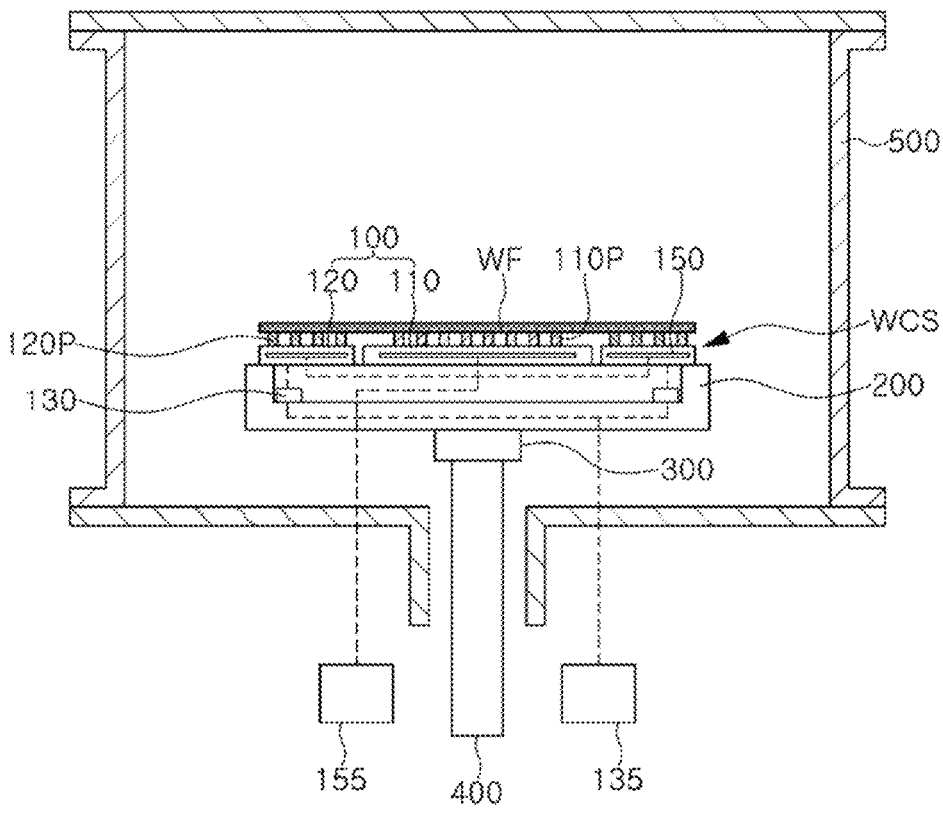
FIG. 12 is a cross-sectional view illustrating an installation state of a wafer chuck to which a wafer chuck system

FIG. 12 is a cross-sectional view illustrating an installation state of a wafer chuck to which a wafer chuck system (WCS) according to some example embodiments of the present inventive concepts is applied.

Referring to FIG. 12, the wafer chuck system WCS according to some example embodiments may include a center plate 110 having a plurality of first protrusions 110P, segmented plates 120 having a plurality of second protrusions 120P, driving units 130 configured to adjust an inclination angle of each of the segmented plates 120 with respect to the center plate 110, and a control unit 135 configured to operate the driving units 130 so that an upper end of at least a portion of the plurality of second protrusions 120P come into contact with a reference plane connecting an upper end of at least a portion of the plurality of first protrusions 110P.

In an example, the center plate 110 and the segmented plates 120 may include a dielectric material or ceramic material, and the wafer chuck system WCS may be an electrostatic chuck (ESC) system further including chucking electrodes 150 embedded in the center plate 110 and the segmented plates 120 and a voltage supply unit 155 (e.g., power supply) supplying power to the chucking electrodes 150. The wafer chuck system WCS may temporarily fix a semiconductor wafer WF seated on the center plate 110 and the segmented plates 120 as electrostatic force is generated on a surface of the wafer chuck table 100 mounted inside the chamber 500. The wafer chuck table 100 may be seated on the support 200. A support shaft 400 and a bellows 300 may be disposed below the support 200. The bellows 300 may be configured to surround the support shaft 400 and to move the support 200 and the wafer chuck table 100 vertically. Process equipment (e.g., exposure equipment, showerhead, etc.) (not shown) for processing the semiconductor wafer WF may be disposed above the chamber 500. However, the technical features of the present inventive concepts are not limited to the wafer chuck table applied to the electrostatic chuck (ESC).

As described herein, any devices, electronic devices, modules, units, controllers, circuits, and/or portions thereof according to any of the example embodiments, and/or any portions thereof (including, without limitation, wafer chuck table 100, center plate 110, segmented plates 120, driving units 130, linear actuator 131, lifting shaft 132, wafer chuck system WCS, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, controllers, units, and/or portions thereof according to any of the example embodiments, and/or any portions thereof, including any of the methods according to any of the example embodiments.

As described herein, a "level" may refer to a magnitude of a height in a vertical direction (e.g., a direction perpendicular to the first reference plane DL1) from a reference location (e.g., a bottom surface of the center plate 110, a top surface of the center plate 110, a top or bottom surface of the wafer chuck table 100, a top or bottom surface of the support 200, a top or bottom surface of the bellows 300, a top or bottom surface of the support shaft 400, etc.).

According to some example embodiments of the present inventive concepts, a wafer chuck table and a wafer chuck system capable of correcting a step difference between a plurality of protrusions by introducing segmented plates whose inclination angle with respect to the center plate is adjusted.

While some example embodiments have been illustrated and described above, it will be apparent to those skilled in the art that modifications and variations could be made without departing from the scope of the present inventive concepts as defined by the appended claims.

What is claimed is:

1. A wafer chuck table, comprising:

a center plate having a plurality of first protrusions, each first protrusion of the plurality of first protrusions having an upper end at least partially defining a first reference plane;

segmented plates arranged around the center plate, each of the segmented plates having a plurality of second protrusions, each second protrusion of the plurality of second protrusions having an upper end at least partially defining a second reference plane such that the segmented plates have separate, respective pluralities of second protrusions at least partially defining separate, respective second reference planes; and driving units configured to adjust a respective inclination angle of each of the segmented plates with respect to the center plate so that the first reference plane and the separate, respective second reference planes are coplanar.

2. The wafer chuck table of claim 1, wherein the segmented plates have an inner edge adjacent to a circumference of the center plate and an outer edge opposite the inner edge, and the wafer chuck table further comprises coupling members connecting the center plate to the inner edge of the segmented plates.

3. The wafer chuck table of claim 2, wherein the segmented plates and the center plate are hinge-coupled by the coupling members.

4. The wafer chuck table of claim 2, wherein the driving units each include at least one linear actuator adjacent to the outer edge of the segmented plates and at least one lifting shaft configured to press one side of each of the segmented plates according to driving of the at least one linear actuator.

5. The wafer chuck table of claim 1, wherein the center plate has a first surface from which the plurality of first protrusions protrude, and the segmented plates each have a second surface from which the plurality of second protrusions protrude.

6. The wafer chuck table of claim 5, wherein, when the first reference plane and the separate, respective second reference planes are aligned to be coplanar by the driving units, the second surface has a particular inclination angle with respect to the first surface.

7. The wafer chuck table of claim 1, wherein the segmented plates have an inner edge adjacent to a circumference of the center plate and an outer edge opposite to the inner edge.

8. The wafer chuck table of claim 7, wherein the driving units include at least one first driving unit adjacent to the outer edge of the segmented plates and configured to adjust a spacing distance of the outer edge of the segmented plates with respect to the first reference plane, and at least one second driving unit adjacent to the inner edge and configured to adjust a spacing distance of the inner edge of the segmented plates with respect to the first reference plane.

9. The wafer chuck table of claim 7, wherein the upper end of each second protrusion of the plurality of second protrusions is inclined toward the outer edge of the segmented plates.

10. The wafer chuck table of claim 1, wherein the plurality of second protrusions are integrated with each of the segmented plates to form protrusion groups.

11. The wafer chuck table of claim 10, wherein the protrusion groups define a plurality of corresponding second reference planes, respectively, and the driving units are configured to adjust an inclination angle of each of the segmented plates with respect to the center plate to be different from an inclination angle of at least one other segmented plate of the segmented plates so that the plurality of corresponding second reference planes are coplanar to the first reference plane.

12. The wafer chuck table of claim 1, wherein the center plate has a first surface from which the plurality of first protrusions protrude, and the wafer chuck table further comprises, cover plates on the segmented plates, respectively, and having a plurality of through holes through which the plurality of second protrusions extend and an upper surface coplanar to the first surface, the plurality of second protrusions protruding from the upper surface.

13. The wafer chuck table of claim 12, wherein, when the first reference plane and the second reference plane are aligned to be coplanar by the driving units, the upper surfaces of the cover plates are coplanar to the first surface.

*　　*　　*　　*　　*